United States Patent
Yamaguchi

(10) Patent No.: US 7,071,549 B2
(45) Date of Patent: Jul. 4, 2006

(54) ACCELERATION SENSOR AND METHOD OF MANUFACTURING ACCELERATION SENSOR

(75) Inventor: Yasuo Yamaguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/219,715

(22) Filed: Sep. 7, 2005

(65) Prior Publication Data

US 2006/0005625 A1   Jan. 12, 2006

Related U.S. Application Data

(62) Division of application No. 10/859,218, filed on Jun. 3, 2004, now Pat. No. 6,953,993.

(30) Foreign Application Priority Data

Dec. 10, 2003   (JP) .............................. 2003-411319

(51) Int. Cl.
  *H01L 23/12*   (2006.01)
  *G01P 15/00*   (2006.01)
(52) U.S. Cl. ..................... 257/704; 73/504.1
(58) Field of Classification Search ................ 73/496, 73/504.1, 504.36, 504.37; 257/704
See application file for complete search history.

(56) References Cited

U.S. PATENT DOCUMENTS

| 5,243,861 A | 9/1993 | Kloeck |
| 5,837,562 A | 11/1998 | Cho |
| 6,400,009 B1 | 6/2002 | Bishop et al. |
| 6,465,854 B1 | 10/2002 | Muenzel et al. |
| 6,762,072 B1 | 7/2004 | Lutz |
| 6,777,259 B1 | 8/2004 | Silverbrook |

FOREIGN PATENT DOCUMENTS

| JP | 9-292409 | 11/1997 |
| JP | P2002-500961 | 1/2002 |

*Primary Examiner*—Hezron Williams
*Assistant Examiner*—John C Hanley
(74) *Attorney, Agent, or Firm*—McDermott Will & Emery LLP

(57) ABSTRACT

An acceleration sensor includes a semiconductor substrate, a sensing element formed on the semiconductor substrate, a bonding frame made of polysilicon which is formed on the semiconductor substrate and surrounds the sensing element, and a glass cap which is bonded to a top surface of the bonding frame made of polysilicon to cover the sensing element above the sensing element while being spaced by a predetermined distance from the sensing element. The bonding frame made of polysilicon is not doped with any impurity.

1 Claim, 6 Drawing Sheets

F I G. 1
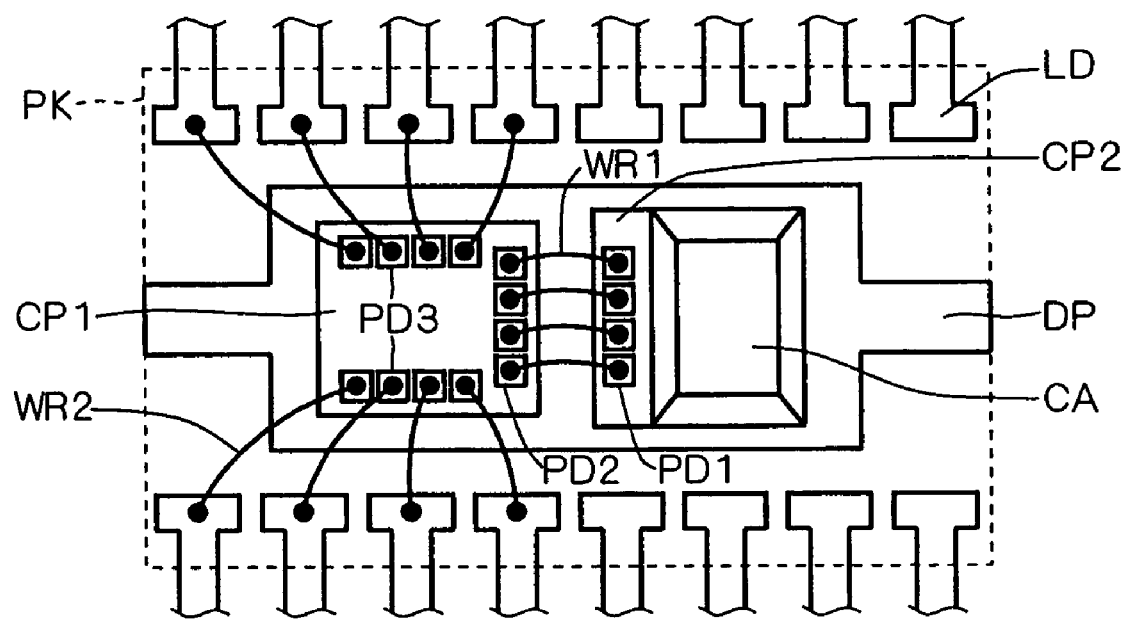

ACCELERATION SENSOR AND METHOD OF MANUFACTURING ACCELERATION SENSOR

RELATED APPLICATIONS

This application is a divisional of application Ser. No. 10/859,218, filed Jun. 3, 2004, now U.S. Pat. No. 6,953,993, which claims priority of Japanese Application No. 2003-411319, filed Dec. 10, 2003, the contents of which are hereby incorporated by reference.

BACKGROUND OF THE INVENTION

1. Field of the Invention

The present invention relates to an acceleration sensor, and more particularly to an acceleration sensor including a cap which covers a sensing element while being spaced by a predetermined distance from the sensing element.

2. Description of the Background Art

In recent days, an air bag system has been employed in most of automobiles on the market. Typically, an air bag system includes an acceleration sensor for detecting impact.

In order to make an acceleration sensor adaptable to incorporation in various types of automobiles, there has conventionally been efforts to reduce a size of an acceleration sensor, as well as its associated costs. For example, concerning a package for covering a semiconductor substrate which forms an acceleration detector and a signal processor of an acceleration sensor, metal which had been most widely used as a material for the package has been superseded by resin.

In the meantime, turning to a structure of an acceleration sensor, a sensing element including a mass body which is a movable portion for detecting an acceleration and the like is formed on a surface of a semiconductor substrate in an acceleration detector. Further, a glass cap is bonded to the surface of the semiconductor substrate in order to keep an admissible motion space of the mass body and prevent entry of dust, water or the like into the admissible motion space. By provision of the glass cap, the admissible motion space of the mass body is completely enclosed.

More specifically, a bonding frame which surrounds the sensing element formed on the semiconductor substrate in plan view is formed on the semiconductor substrate. It is noted that polysilicon doped with impurities which is used as a material for the sensing element is also used as a material for the bonding frame. The bonding frame is in contact with an end portion of the glass cap. With the bonding frame and the end portion of the glass cap being kept in contact with each other, the glass cap and the semiconductor substrate are bonded to each other by anodic bonding for purposes of improving heremeticity or the like (please refer to National Publication of Translation No. 2002-500961 and Japanese Patent Application Laid-Open No. 9-292409, for example).

However, since the bonding frame is formed of polysilicon doped with impurities, the above-described structure has suffered from problems associated with anodic bonding, as follows.

Upon application of a voltage in anodic bonding, the impurities contained in the bonding frame are precipitated out in a portion of the bonding frame near a bonding interface. As anodic bonding to bond the glass cap and the bonding frame is achieved by uniting together glass of the glass cap and polysilicon of the bonding frame, the precipitated impurities existing between the glass of the glass cap and the polysilicon of the bonding frame would reduce a bonding strength between the glass cap and the bonding frame.

That is, to allow the impurities to be precipitated out near the bonding interface would cause reduction of the bonding strength between the glass cap and the bonding frame.

SUMMARY OF THE INVENTION

It is an object of the present invention to provide an acceleration sensor which provides for improvement of a bonding strength between a bonding frame and a cap, and a method of manufacturing such an acceleration sensor.

According to a first aspect of the present invention, an acceleration sensor includes a substrate, a sensing element, a polysilicon bonding frame and a cap. The sensing element is formed on the substrate. The polysilicon bonding frame is formed on the substrate, and surrounds the sensing element in plan view. The cap includes an end face bonded to a top surface of the polysilicon bonding frame. Also, the cap covers the sensing element above the sensing element while being spaced by a predetermined distance from the sensing element. The polysilicon bonding frame is not doped with any impurity.

Even if anodic bonding between the polysilicon bonding frame and the cap is carried out, no impurity is precipitated out in a portion of the polysilicon bonding frame near a bonding interface between the cap and the polysilicon bonding frame. Thus, precipitation of an impurity near the bonding interface which has disadvantageously caused reduction of a bonding strength of a bond resulted from anodic bonding in accordance with the conventional practices can be prevented. Hence, it is possible to bond the polysilicon bonding frame and the cap more strongly.

According to a second aspect of the present invention, an acceleration sensor includes a substrate, a sensing element, a bonding frame and a cap. The sensing element is formed on the substrate. The bonding frame is formed on the substrate and surrounds the sensing element in plan view. The cap includes an end face bonded to a top surface of the bonding frame. Also, the cap covers the sensing element above the sensing element while being spaced by a predetermined distance from the sensing element. The bonding frame includes a first polysilicon layer, an insulating film and a second polysilicon layer. The first polysilicon layer is doped with an impurity. The insulating film is formed on the first polysilicon layer. The second polysilicon layer is formed on the insulating film, and not doped with any impurity. The cap is bonded to the second polysilicon layer.

The acceleration sensor according to the second aspect of the present invention can produce the same effects as produced by the acceleration sensor according to the first aspect of the present invention, and further, allows a height of the bonding frame to be easily controlled. Moreover, even if anodic bonding between the bonding frame and the cap is carried out, it is possible to prevent the impurity contained in the first polysilicon layer from diffusing into the second polysilicon layer because of the provision of the insulating film between the first polysilicon layer and the second polysilicon layer.

According to a third aspect of the present invention, an acceleration sensor includes a substrate, a sensing element, a polysilicon bonding frame, a cap, a metal film, a first pad, a second pad and a third pad. The sensing element is formed on the substrate. The polysilicon bonding frame is formed on the substrate and surrounds the sensing element in plan view.

The cap includes an end face bonded to a top surface of the polysilicon bonding frame. Also, the cap covers the sensing element above the sensing element while being spaced by a predetermined distance from the sensing element. The metal film is formed on a surface of the cap which faces the sensing element. Also, a portion of the metal film is bonded to the polysilicon bonding frame. The first pad is formed on the substrate and is electrically connected to the sensing element via a first interconnect line. The second pad is electrically connected to the substrate. The third pad is formed on the substrate and is electrically connected to the polysilicon bonding frame via a second interconnect line.

With all of the first pad, the second pad and the third pad being electrically connected to one another, anodic bonding between the polysilicon bonding frame and the cap is carried out. In this manner, even with a voltage being applied in anodic bonding, the substrate, the polysilicon bonding frame, the sensing element, the metal film and the like are held at the same potential by virtue of electrical connection among the first, second and third pads. Accordingly, even if anodic bonding is carried out, no electrostatic force is caused between the sensing element and the other elements, so that it is possible to prevent the sensing element from being attracted to, and moving toward, the other elements.

According to a fourth aspect of the present invention, a method of manufacturing an acceleration sensor includes the steps (a), (b) and (c). The acceleration sensor includes a substrate, a sensing element, a polysilicon bonding frame, a cap, a first metal film, a first pad, a second pad and a third pad. The sensing element is formed on the substrate. The polysilicon bonding frame is formed on the substrate and surrounds the sensing element in plan view. The cap includes an end face bonded to a top surface of the polysilicon bonding frame. Also, the cap covers the sensing element above the sensing element while being spaced by a predetermined distance from the sensing element. The first metal film is formed on a surface of the cap facing the sensing element. Also, a portion of the first metal film is bonded to the polysilicon bonding frame. The first pad is formed on the substrate and is electrically connected to the sensing element via a first interconnect line. The second pad is electrically connected to the substrate. The third pad is formed on the substrate and is electrically connected to the polysilicon bonding frame via a second interconnect line. The step (a) is to form a second metal film for electrically connecting the first pad, the second pad and the third pad. The step (b) is to carry out anodic bonding between the cap and the polysilicon bonding frame by applying a voltage between the substrate and the cap after the step (a). The step (c) is to remove the second metal film after the step (b).

Even if anodic bonding between the polysilicon bonding frame and the cap is carried out, respective elements (the sensing element, the cap and the like) are held at the same potential. Accordingly, it is possible to prevent the sensing element from moving toward the cap, for example, during anodic bonding.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of an overall structure of an acceleration sensor.

DESCRIPTION OF THE PREFERRED EMBODIMENTS

Below, the present invention will be described in more detail by making reference to the accompanying drawings which illustrate preferred embodiments of the present invention.

First Preferred Embodiment

FIG. 1 is a top view illustrating an overall structure of an acceleration sensor according to a first preferred embodiment. As illustrated in FIG. 1, the acceleration sensor according to the first preferred embodiment includes a signal processing chip CP1, an acceleration detecting chip CP2 functioning as an acceleration detector, a lead LD, and a die pad DP.

Both the signal processing chip CP1 and the acceleration detecting chip CP2 are mounted on the die pad DP. A pad PD1 of the acceleration detecting chip CP2 and a pad PD 2 of the signal processing chip CP1 are connected to each other via a wire WR1, while a pad PD3 of the signal processing chip CP1 and the lead LD are connected to each other via a wire WR2. The foregoing elements included in the acceleration sensor according to the first preferred embodiment which are arranged as described above are covered with a package PK made of resin.

In this regard, a portion of the lead LD is not covered with, and protrudes from, the package PK made of resin, to function as a terminal connected to an external component. It is noted that FIG. 1 illustrates a structure inside the package PK made of resin when it is seen through the package PK which is denoted by hidden lines (broken lines).

Figure 2:
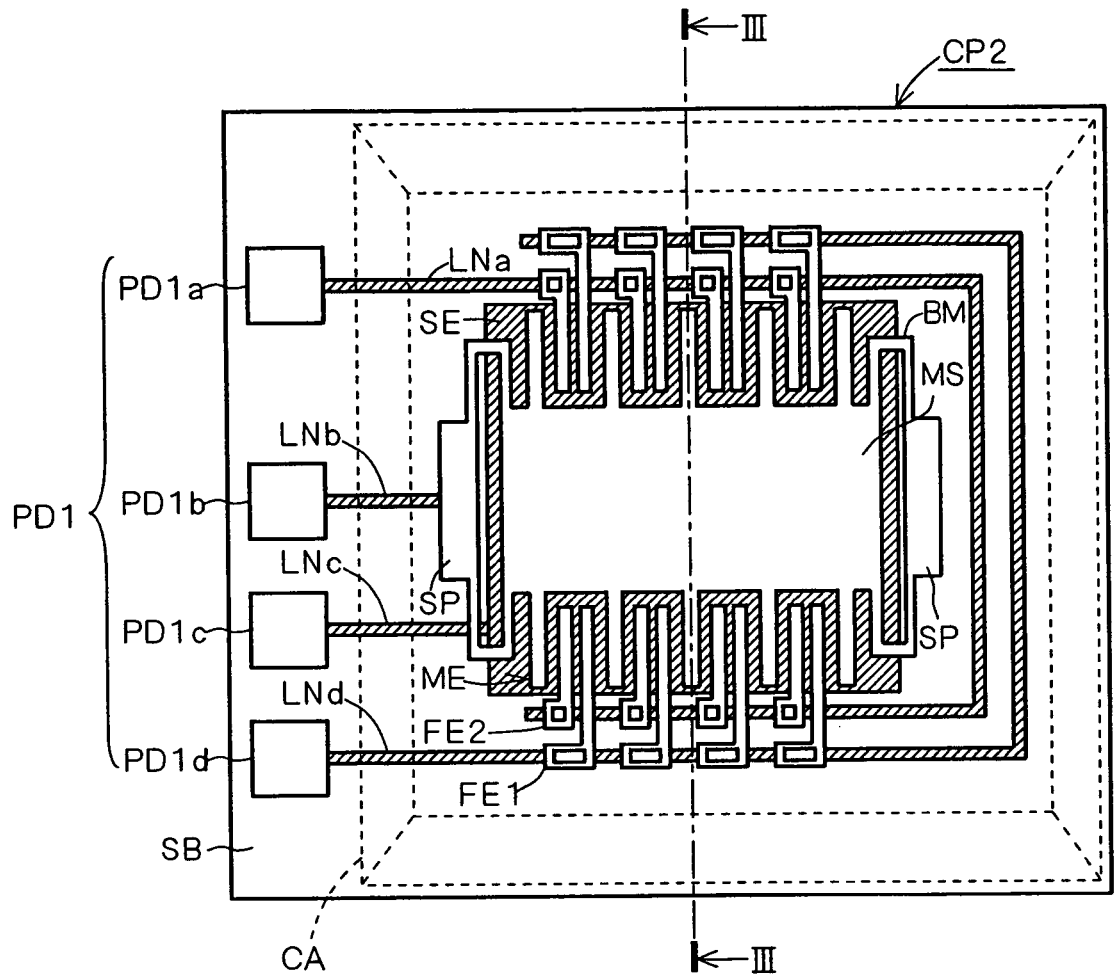
FIG. 2 is a plan view of an acceleration detecting chip according to a first preferred embodiment.
Figure 3:
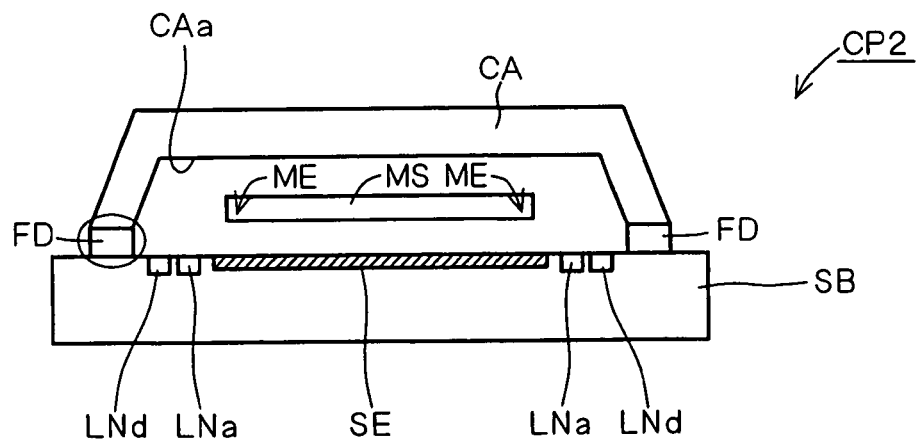
FIG. 3 is a sectional view of the acceleration detecting chip according to the first preferred embodiment.

FIG. 2 is a top view of the acceleration detecting chip CP2 and FIG. 3 is a sectional view of the acceleration detecting chip CP2. The sectional view of FIG. 3 is taken along a line III—III of FIG. 2.

As illustrated in FIGS. 1, 2 and 3, a cap CA made of glass or the like is bonded to a surface of a semiconductor substrate SB of the acceleration detecting chip CP2. It is noted that FIG. 2 illustrates a structure inside the cap CA when it is seen through the cap CA which is denoted by hidden lines (broken lines).

Referring to FIG. 2, pads PD1*a*, PD1*b*, PD1*c* and PD1*d* which form the pad PD1 are formed in a portion of the semiconductor substrate SB including the surface of the semiconductor substrate SB ("surface portion"). Also, interconnect lines LNa, LNb, LNc and LNd which are connected to the pads PD1a, PD1b, PD1c and PD1d, respectively are provided in the surface portion of the semiconductor substrate SB, as illustrated in FIGS. 2 and 3. Further, a shield electrode SE connected to the interconnect line LNc is formed in the surface portion of the semiconductor substrate SB.

Moreover, a sensing element made of polysilicon in the form of a thin film is formed on the semiconductor substrate SB. The sensing element is doped with impurities such as phosphorus, in order to make the sensing element electrically conductive. It is additionally noted that gallium, boron, arsenic and the like can be employed as impurities for doping, in place of phosphorus.

The sensing element includes a mass body MS for detecting an acceleration, a fixed electrode FE1 connected to the interconnect line LNd, a fixed electrode FE2 connected to the interconnect line LNa, a support SP which supports the mass body MS and is connected to the interconnect line LNb, and the like. The mass body MS is jointed to the support SP via a beam BM, and thus is held in the air as illustrated in FIG. 3.

The sensing element on the semiconductor substrate SB is manufactured by semiconductor manufacturing processes. More specifically, respective elements illustrated in FIGS. 1, 2 and 3 are manufactured by utilizing techniques such as photolithography, etching, ion implantation of impurities, and the like. For example, the mass body MS, the fixed electrodes FE1 and FE2, the support SP, the beam BM and the like are manufactured so as to exhibit the configuration as illustrated in the figures by epitaxially growing silicon on the semiconductor substrate SB and patterning the epitaxially grown silicon with the use of photolithography and etching.

A movable electrode ME shaped like a comb is provided in each of opposite wing portions of the mass body MS. The fixed electrodes FE1 and FE2 are arranged so as to face the movable electrode ME. Given such arrangement, when accelerated, the beam BM is bent to shift the position of the mass body MS, so that a distance between the movable electrode ME and each of the fixed electrodes FE1 and FE2 is changed. The change of the distance between the movable electrode ME and each of the fixed electrodes FE1 and FE2 is followed by change of an electrostatic capacitance existing between the movable electrode ME and each of the fixed electrodes FE1 and FE2. Accordingly, by monitoring change of an electrostatic capacitance between the movable electrode ME and each of the fixed electrodes FE1 and FE2, it is possible to detect an acceleration.

That is, the mass body MS functions as a movable portion for detecting an acceleration, and the fixed electrodes FE1 and FE2 and the movable electrode ME of the mass body MS function as an acceleration detector.

The cap CA is bonded to a bonding frame FD formed on the semiconductor substrate SB, to keep and completely enclose an admissible motion space of the mass body MS.

More specifically, the bonding frame FD is formed on the semiconductor substrate SB so as to surround the sensing element in plan view, as illustrated in FIGS. 2 and 3.

It is noted that a portion of the bonding frame FD (a portion denoted by a reference numeral "FD1" in FIG. 4) is manufactured in the same step that is performed for manufacturing the sensing element. Accordingly, the portion of the bonding frame FD (the portion denoted by the reference numeral "FD1" in FIG. 4) is formed of polysilicon doped with impurities such as phosphorus, as is the case with the sensing element.

A top surface of the bonding frame FD and an end face of the cap CA are bonded to each other so that a top surface of the sensing element is covered with the cap CA while being spaced by a predetermined distance from the cap CA. The sensing element is totally enclosed by bonding the cap CA and the bonding frame FD to each other.

The cap CA is made of glass, and bonded to the bonding frame FD by anodic bonding. It is noted that anodic bonding is a method of bonding glass containing an alkaline metal ion such as sodium or lithium and a metal (or a semiconductor) as an anode to each other, and is accomplished by applying a several hundred voltage across the glass and the metal at a temperature of approximately 400° C. at which thermal diffusion of the alkaline metal ion can take place. In general, anodic bonding is carried out for a period of time in a range of several tens of minutes to several hours.

Anodic bonding may be carried out in vacuum. Alternatively, anodic bonding may be carried out under conditions where a predetermined pressure is maintained by using an inert gas, in which case a pressure inside the cap CA which is provided after the cap CA is bonded to the bonding frame FD can be controlled to be equal to the predetermined pressure.

Further, a side face of the cap CA includes a trapezoidal sloping face with a width which is the smallest at a junction with the top surface of the cap CA and increases as a distance from a bonding interface between the cap CA and the bonding frame FD decreases. Reasons for such configuration of the side face of the cap CA will be set out as follows.

In carrying out a molding process for forming the package made of resin which covers the acceleration sensor, a force caused due to thermal shrinkage or the like of the package made of resin is applied to the side face of the cap CA. The force applied to the side face of the cap CA is transmitted to the semiconductor substrate SB via the bonding frame FD. A force acting on the semiconductor substrate SB in a direction perpendicular to the semiconductor substrate SB would not so significantly affect the sensing element even if the force is transmitted to the semiconductor substrate SB. However, if a force acting on the semiconductor substrate SB in a direction horizontal to the semiconductor substrate SB is transmitted to the semiconductor substrate SB, the force in the horizontal direction correspondingly affects the sensing element, to cause degradation in accuracy of the sensing element.

In view of this, the side face of the cap CA is configured to be sloping and have the above-mentioned trapezoidal shape. Because of this configuration, a force applied to the side face of the cap CA during the molding process for formation of the package made of resin can be dispersed in the direction perpendicular to the semiconductor substrate SB.

Accordingly, a force acting on the semiconductor substrate SB in the direction horizontal to the semiconductor substrate SB can be reduced as compared to a configuration in which the side face of the cap CA stands upright relative to a main surface of the semiconductor substrate SB. As a result, the accuracy of the sensing element can be improved.

It is additionally noted that to form the above-noted trapezoidal sloping face in at least a portion of the side face of the cap CA could suffice for producing the above effects, though to do so may lessen the above effects as compared to a case in which the entire side face of the cap CA is made sloping and trapezoidal with a width which increases as a distance from the bonding interface decreases.

Further, a recess portion CAa is formed in the cap CA in order to allow the cap CA to cover the top surface of the sensing element while being spaced by a predetermined distance from the top surface of the sensing element. The formation of the recess portion CAa makes it possible to prevent the sensing element from coming into contact with the cap CA. The recess portion CAa is formed by carrying out etching or sandblasting on a surface of the cap CA which faces the sensing element.

A depth of the recess portion CAa is determined depending on a thickness of the sensing element. For example, by making the depth of the recess portion CAa approximately equal to the thickness of the sensing element, it is possible to limit movement of the sensing element toward the cap CA. On the other hand, to make a distance between the sensing element and the cap CA relatively small would produce another effects. Specifically, even if the sensing element moves toward the cap CA and collides against the cap CA, damages to the sensing element which might be caused due to the collision can be minimized because collision energy delivered to the sensing element is small by virtue of the relatively small distance between the sensing element and the cap CA.

Figure 4:
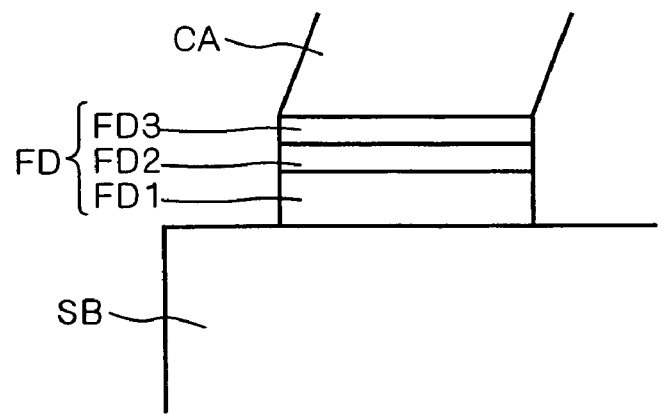
FIG. 4 is an enlarged sectional view of a bonding frame and its peripheral region according to the first preferred embodiment.

Next, a structure of the bonding frame FD will be described in more detail by making reference to FIG. 4. FIG. 4 is an enlarged view of a circled portion in FIG. 3.

As illustrated in FIG. 4, the bonding frame FD includes a layered structure in which a doped polysilicon layer FD1 which is doped with impurities, an insulating film FD2 such as an oxide film or a nitride film, and an undoped polysilicon layer FD3 which is not doped with any impurity are deposited sequentially in the order of occurrence in this explanation.

To achieve anodic bonding between the bonding frame FD with the foregoing layered structure and the cap CA requires application of a voltage which is approximately twice a voltage applied in anodic bonding between polysilicon doped with impurities and a glass cap, because of the inclusion of the undoped polysilicon layer FD3.

More specifically, a voltage applied in anodic bonding between polysilicon doped with impurities and a glass cap is approximately 200 V, and a voltage applied in anodic bonding between the undoped polysilicon layer FD3 and the cap CA is approximately 400 V. It is noted that conditions regarding heat treatment in anodic bonding are the same whether polysilicon subjected to anodic bonding is doped with impurities or not.

In the foregoing layered structure of the bonding frame FD, the insulating film FD2 functions to suppress diffusion of the impurities contained in the doped polysilicon layer FD1 which are likely to diffuse during anodic bonding between the bonding frame FD and the cap CA. As a result, it is possible to prevent diffusion of the impurities into the undoped polysilicon layer FD3.

Thus, even if anodic bonding is carried out, no impurity is precipitated out in a portion of the undoped polysilicon layer FD3 near the bonding interface, to thereby overcome the problems caused in the structure set forth in the "Background" section of the present specification (that is, the problems associated with anodic bonding between a glass cap and polysilicon doped with impurities). In particular, reduction of a bonding strength can be prevented, to thereby provide for improvement in a bonding strength between the bonding frame FD and the cap CA.

It is noted that though the above description has been made about a case where the bonding frame FD includes a layered structure, the bonding frame FD may include only the undoped polysilicon layer FD3, alternatively. In this alternative, there is a need of covering the bonding frame FD with a mask in doping the sensing element with impurities, to prevent the bonding frame FD from being doped with the impurities.

Figure 5:
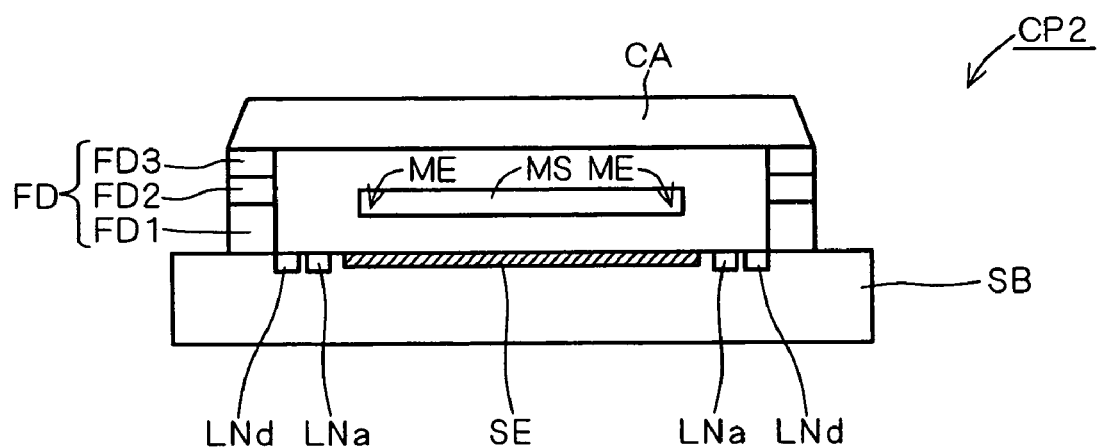
FIG. 5 is a sectional view for illustrating a case in which the acceleration detecting chip according to the first preferred embodiment includes a flat cap.

Further, in the case where the bonding frame FD includes the above-noted layered structure, it is possible to allow the cap CA to dispense with the recess portion CAa (in other words, it is possible to employ a flat cap CA for covering the sensing element) by appropriately controlling a height of the layered structure (please refer to FIG. 5). This would eliminate a need of carrying out sandblasting or the like on the cap CA for forming the recess portion CAa, resulting in reduction in manufacturing cost.

Second Preferred Embodiment

When anodic bonding is carried out on the acceleration sensor illustrated in FIG. 3, to bond the bonding frame FD and the cap CA to each other, for example, the mass body MS which is a movable portion of the sensing element moves toward a top surface of the cap CA under the influence of an electrostatic force in some cases. Such movement may cause the mass body MS to come into contact with the recess portion CAa of the cap CA, which results in anodic bonding also between the mass body MS and the cap CA so that the mass body MS is sticking to the cap CA.

Figure 6:
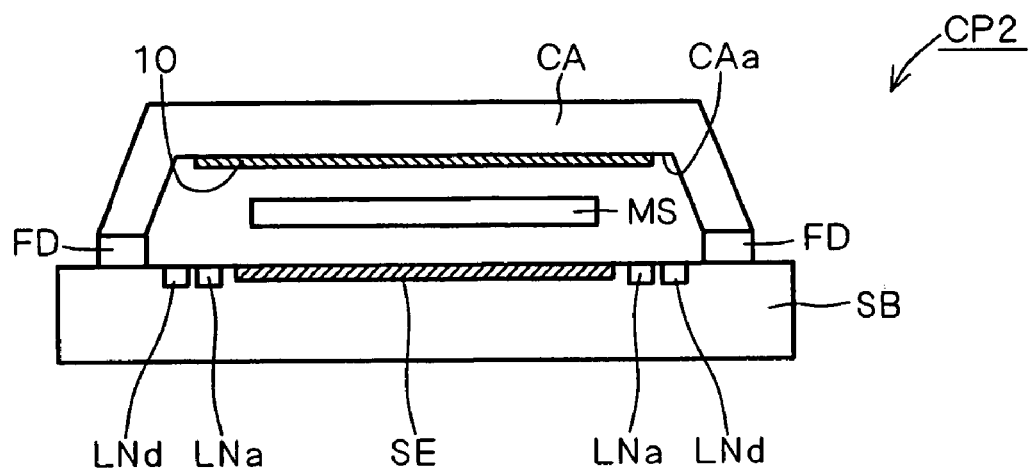
FIG. 6 is a sectional view for illustrating a state in which a metal film is formed in a cap of an acceleration detecting chip according to a second preferred embodiment.

One solution to prevent anodic bonding between the mass body MS and the cap CA is to form a metal film 10 in a bottom portion of the recess portion CAa of the cap CA (in other words, on a surface of the cap CA which faces the sensing element) as illustrated in FIG. 6. As a result of the formation of the metal film 10 between the mass body MS and the cap CA, even if the mass body MS comes into contact with the bottom portion of the recess portion CAa of the cap CA due to application of a voltage across the semiconductor substrate SB and the cap CA in anodic bonding between the bonding frame FD and the cap CA, the mass body MS returns to the original position after the anodic bonding. In this manner, it is possible to prevent the mass body MS from being sticking to the cap CA.

Nonetheless, the structure illustrated in FIG. 6 is still incapable of preventing the mass body MS from moving toward the cap CA under the influence of an electrostatic force caused during anodic bonding. Further, an electrostatic force is caused also between the mass body MS and the other elements than the cap CA (the fixed electrodes FE1 and FE2, the shield electrode SE, and the like) during anodic bonding, so that the mass body MS moves toward, and comes into contact with, the other elements. Such unnecessary movement of the mass body MS during manufacture is undesirable.

Figure 7:
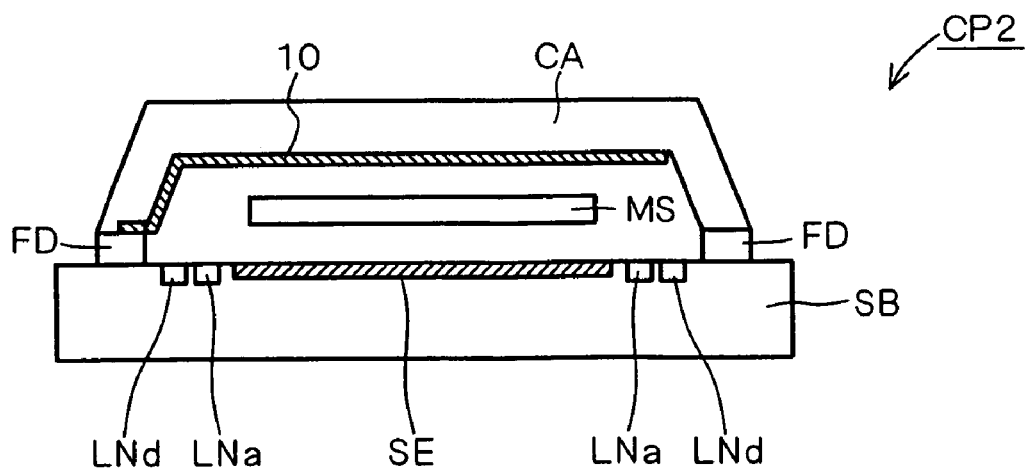
FIG. 7 is a sectional view for illustrating a state in which a metal film with a lengthened portion is formed in the cap of the acceleration detecting chip according to the second preferred embodiment.

In view of this, in an acceleration sensor according to a second preferred embodiment, the metal film 10 is formed in the bottom portion of the recess portion CAa of the cap CA, and further, a portion of the metal film 10 is interposed between the bonding frame FD and the cap CA. In other words, the metal film 10 illustrated in FIG. 6 is lengthened to reach and be connected to the bonding frame FD, as illustrated in FIG. 7.

Figure 8:
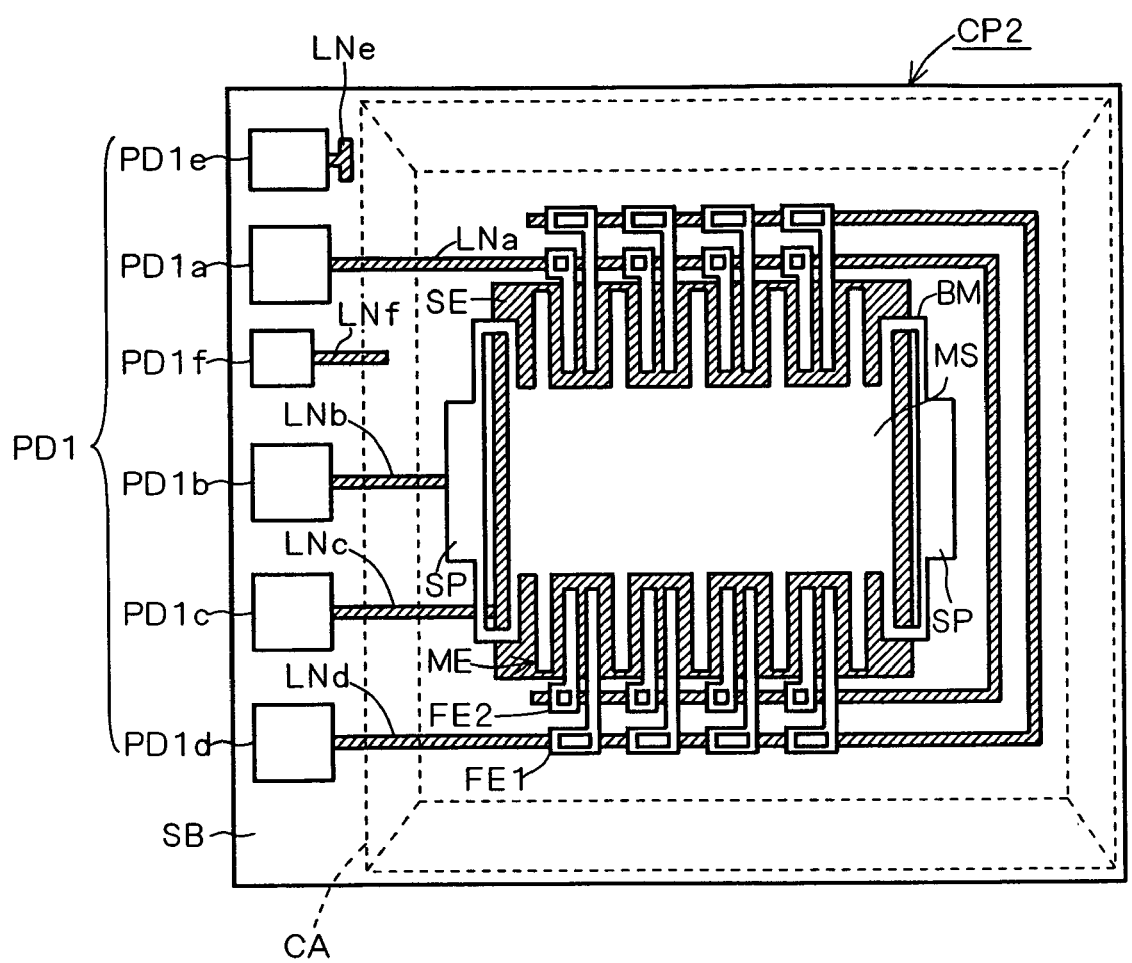
FIG. 8 is a plan view of a structure of the acceleration detecting chip according to the second preferred embodiment.

Moreover, the acceleration sensor according to the second preferred embodiment which is illustrated in a plan view of FIG. 8 is different from the acceleration sensor illustrated in FIG. 2 also in that pads PD1*e* and PD1*f* are additionally provided in the surface portion of the semiconductor substrate SB. Furthermore, interconnect lines LNe and LNf connected to the pads PD1e and PD1f, respectively, are further provided in the surface portion of the semiconductor substrate SB. The interconnect line LNe is connected also to the semiconductor substrate SB. Accordingly, the pad PD1e and the semiconductor substrate SB are connected with each other via the interconnect line LNe. On the other hand, the interconnect line LNf is connected also to the bonding frame FD. Accordingly, the pad PD1f and the bonding frame FD are connected with each other via the interconnect line LNf.

It is noted that FIG. 8 illustrates a structure inside the cap CA when it is seen through the cap CA which is denoted by hidden lines (broken lines).

Figure 9:
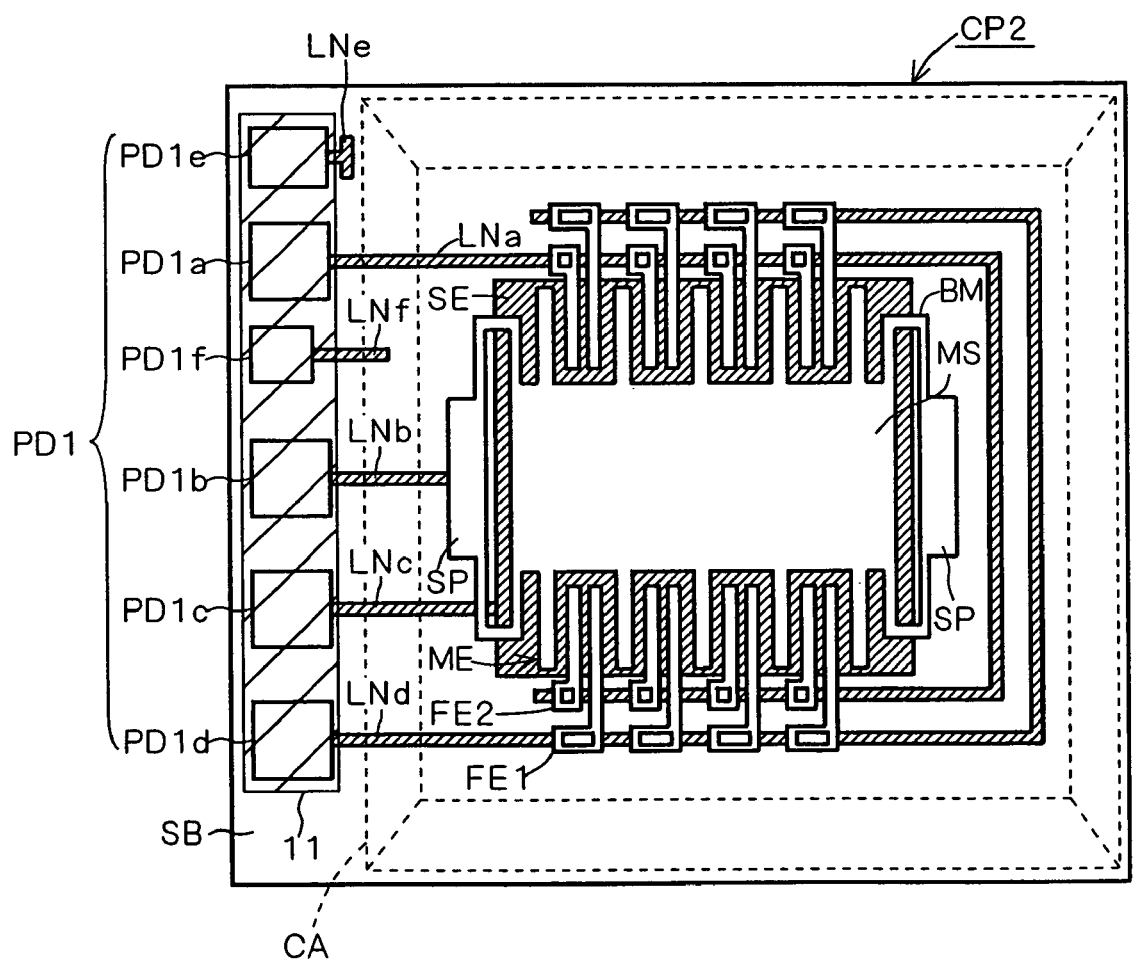
FIG. 9 illustrates a state in which respective pads are electrically connected to one another in the acceleration detecting chip according to the second preferred embodiment.

In manufacturing the acceleration sensor with the foregoing structure, a metal film 11 electrically connected to all the pads PD1a, PD1b, PD1c, PD1d, PD1e and PD1f is formed to extend over all the pads PD1a, PD1b, PD1c, PD1d, PD1e and PD1f, prior to anodic bonding of the cap CA to the bonding frame FD. The state where the metal film 11 is formed is illustrated in FIG. 9.

With the metal film 11 being formed as described above, a voltage is applied between the semiconductor substrate SB and the cap CA to accomplish anodic bonding.

Even with a voltage being applied between the semiconductor substrate SB and the cap CA during anodic bonding, the semiconductor substrate SB, the metal film 10, the mass body MS, the fixed electrodes FE1 and FE2, the shield electrode SE, the bonding frame FD and the like are held at the same potential because all of those elements are electrically connected via the metal film 11.

Accordingly, no electrostatic force is caused between the elements which are held at the same potential during anodic bonding. Hence, it is possible to prevent the mass body MS from being attracted to, and moving toward, the other elements during anodic bonding. This provides for increase in yield of an acceleration sensor which is likely to be reduced due to movement of the mass body MS during anodic bonding.

After anodic bonding is finished, the metal film 11 is removed. The acceleration sensor provided after anodic bonding includes the pads PD1a, PD1b, PD1c, PD1d, PD1e and PD1f which are electrically separated from one another, and the metal film 10 connected to a portion of the bonding frame.

Thus, after anodic bonding is finished, each of the pads PD1a, PD1b, PD1c, PD1d, PD1e and PD1f can be used as a pad for wire bonding. On the other hand, the metal film 10 is left un-removed after anodic bonding because the metal film 10 can function to block external noises during operation of the acceleration sensor. The inclusion of the metal film 10 makes it possible to prevent electrical characteristics of the sensing element from being adversely affected by external noises during operation of the acceleration sensor.

While the invention has been shown and described in detail, the foregoing description is in all aspects illustrative and not restrictive. It is therefore understood that numerous modifications and variations can be devised without departing from the scope of the invention.

What is claimed is:

1. An acceleration sensor comprising:
a substrate;
a sensing element formed on said substrate;
a bonding frame formed on said substrate, said bonding frame surrounding said sensing element in plan view; and
a cap which includes an end face bonded to a top surface of said bonding frame, to cover said sensing element above said sensing element while being spaced by a predetermined distance from said sensing element, wherein
said bonding frame includes:
a first polysilicon layer doped with an impurity;
an insulating film formed on said first polysilicon layer; and
a second polysilicon layer formed on said insulating film, said second polysilicon layer being not doped with any impurity, and
said cap is bonded to said second polysilicon layer.

* * * * *